United States Patent [19]

Hayakawa et al.

[11] Patent Number: 4,887,274
[45] Date of Patent: Dec. 12, 1989

[54] DETERIORATION-RESISTANT SUPERLATTICE SEMICONDUCTOR LASER DEVICE

[75] Inventors: Toshiro Hayakawa, Nara; Takahiro Suyama, Tenri; Kosei Takahashi, Tenri; Masafumi Kondo, Tenri, all of Japan

[73] Assignee: Sharp Kabushiki Kaisha, Osaka, Japan

[21] Appl. No.: 132,520

[22] Filed: Dec. 14, 1987

[30] Foreign Application Priority Data

Dec. 15, 1986 [JP]  Japan ................................ 61-298175

[51] Int. Cl.$^4$ ............................................. H01S 3/19
[52] U.S. Cl. ........................................... 372/45; 357/4; 357/17
[58] Field of Search ....................... 372/44, 45; 357/16, 357/17, 90

[56] References Cited

U.S. PATENT DOCUMENTS

| | | | |
|---|---|---|---|
| 4,366,569 | 12/1982 | Hirao et al. | 372/46 |
| 4,416,012 | 11/1983 | Botez et al. | 372/45 |
| 4,480,331 | 10/1984 | Thompson | 372/45 |
| 4,512,022 | 4/1985 | Tsang | 372/45 |
| 4,573,161 | 2/1986 | Sakai et al | 372/45 |
| 4,631,802 | 12/1986 | Hayashi et al. | 29/576 E |
| 4,635,268 | 1/1987 | Motegi et al. | 372/45 |
| 4,745,612 | 5/1988 | Hayakawa et al. | 372/45 |
| 4,750,183 | 6/1988 | Takahashi et al. | 372/45 |
| 4,757,510 | 6/1988 | Kaheno et al. | 372/45 |

FOREIGN PATENT DOCUMENTS

| | | |
|---|---|---|
| 0044571 | 1/1982 | European Pat. Off. . |
| 0125738 | 11/1984 | European Pat. Off. . |
| 0206496 | 12/1986 | European Pat. Off. . |
| 0210616 | 2/1987 | European Pat. Off. . |
| 0215298 | 3/1987 | European Pat. Off. . |
| 59-48976 | 3/1984 | Japan . |
| 61-207090 | 9/1986 | Japan . |
| 1378128 | 12/1974 | United Kingdom . |
| 2100501A | 12/1982 | United Kingdom . |

OTHER PUBLICATIONS

T. Hayakawa et al., *J. Appl Phys* (1981) 52:6068-73.
W. T. Tsang, *Appl Phys Lett* (1981) 39:786-88.
N. K. Dutta, *J Appl Phys* (1982) 53:7211-14.
H. Iwamura et al., *Elect Lett* (1983) 19:180-81.
Patent Abstracts of Japan (Nov. 29, 1985) 9(302), E-362, 2025, Appl. No. 58-250138.
Patent Abstracts of Japan (Jun. 28, 1984) 8(139), E-253, 1576, Appl. No. 57-160054.
Patent Abstracts of Japan (Nov. 22, 1984) 8(256), E-280, 1693, Appl. No. 59-127893.
Xerox Disclosure Journal, vol. 11, No. 4, Jul./Aug. 1986, D. L. Smith, "A Method for Fabrication an Index Guided Laser" pp. 151 & 152, Applied Physics Letters, vol. 49, No. 11, Sep. 15, 1986, T. Hayakawa et al., note page 152 paragraph 2.
"Low Current Threshold AlGaAs Visible Laser Diodes . . .", pp. 636 to 638, note FIG. 3.

Primary Examiner—John D. Lee
Assistant Examiner—B. R. R. Holloway
Attorney, Agent, or Firm—Irell & Manella

[57] ABSTRACT

A semiconductor laser device comprising a quantum well region with a superlattice structure that functions as an active region, wherein the superlattice quantum well region is composed of alternate layers consisting of a plurality of first $Al_xGa_{1-x}As$ thin films and a plurality of second $Al_yGa_{1-y}As$ thin films ($0<x<y\leq 1$).

3 Claims, 2 Drawing Sheets

DETERIORATION-RESISTANT SUPERLATTICE SEMICONDUCTOR LASER DEVICE

BACKGROUND OF THE INVENTION

1. Field of the Invention

This invention relates to a semiconductor laser device that oscillates laser light with an oscillation wavelength in the visible region, especially, a high quality quantum well semiconductor laser device with a superlattice structure that can be readily produced by molecular beam epitaxy.

2. Description of the Prior Art

In recent years, epitaxial growth techniques such as molecular beam epitaxy (MBE) and metal organic-chemical chemical vapor deposition (MOCVD) have been rapidly advanced. By these growth techniques, it is possible to obtain epitaxial growth layers of extreme thinness, on the order of 10 Å. Due to the progress in these crystal growth techniques, it is possible to make laser devices based on device structures having very thin layers, which could not be easily manufactured by conventional liquid phase epitaxy. A typical example of these laser devices is the quantum well (QW) laser, in which the active layer has a thickness of 100 Å or less resulting in the formation of quantum levels therein, whereas the active layer of the conventional double-heterostructure (DH) laser has a thickness of several hundreds of angstroms or more. Thus, this QW laser is advantageous over the conventional DH laser is that the threshold current level is reduced, the temperature characteristics are excellent, and the transient characteristics are excellent. This has been reported by W. T. Tsang, *Applied Physics Letters* (vol. 39, No. 10, pp. 786, 1981); N. K. Dutta, *Journal of Applied Physics* (vol. 53, No. 11, pp. 7211 1982); and H. Iwamura et al., *Electronics Letters* (vol. 19, No. 5, pp. 180, 1983).

As mentioned above, by the use of epitaxial growth techniques such as MBE and MOCVD, it is now possible to put high quality semiconductor laser devices having a new multiple-layered structure into practical use. As an AlGaAs quantum well laser that oscillates at a low threshold current level, the inventors of this invention have proposed a superlattice quantum well semiconductor laser device (for example, T. Hayakawa et al., *Applied Physics Letters* (vol. 49, No. 11, pp. 636 1986)), which can be readily manufactured. It comprises a superlattice quantum well region, which is composed of alternate layers consisting of GaAs layers and $Al_xGa_{1-x}As$ ($0<x<1$) layers (each of the said layers having a thickness of several mono-layers or less), and optical guiding layers sandwiching the said superlattice quantum well region therebetween. The AlAs mole fraction (i.e., x) of each of the said optical guiding layers is continuously varied.

FIG. 3 shows the AlAs mole fraction (i.e., x) in an $Al_xGa_{1-x}As$ mixed crystal in the above-mentioned conventional quantum well semiconductor laser device with a graded-index separate-confinement heterostructure (GRIN-SCH) having an oscillation wavelength in the visible region. The quantum well region 15 has a superlattice structure that is composed of alternate layers consisting of four GaAs layers with a five mono-layer thickness each and three $Al_{0.28}Ga_{0.72}As$ layers with a two mono-layer thickness each. The thickness of the quantum well region 15 is 73.58 Å (a mono-layer thickness being 2.83 Å). GRIN layers 4 and 6 that sandwich the quantum well region 15 therebetween function as optical guiding layers and are made of non-doped $Al_xGa_{1-x}As$ in which the AlAs mole fraction (i.e., x) varies from 0.7 to 0.28 according to the parabolic distribution. Cladding layers 3 and 7 are constituted by n- and p-$Al_{0.7}Ga_{0.3}As$ crystals, respectively. The semiconductor laser device having the AlAs mole fraction shown in FIG. 3, when it has a cavity length of 250 μm, oscillates laser light with an oscillation wavelength of 785 nm at an extremely low threshold current level of 368 A/cm².

The above-mentioned single quantum well laser device having the AlAs mole fraction such as that shown in FIG. 3 is advantageous in that the superlattice structure thereof can be made by MBE and moreover GaAs layers containing no aluminum are used in the superlattice structure, and thus the growth of thin crystal films using MBE can be attained by a single Al cell functioning as a aluminum supplier. However, the above-mentioned laser device is disadvantageous in that the GaAs thin films contained in the single quantum well with a superlattice structure tend to deteriorate resulting in poor reliability.

SUMMARY OF THE INVENTION

The semiconductor laser device of this invention, which overcomes the above-discussed and numerous other disadvantages and deficiencies of the prior art, comprises a quantum well region with a superlattice structure that functions as an active region, wherein said superlattice quantum well region is composed of alternate layers consisting of a plurality of first $Al_xGa_{1-x}As$ thin films and a plurality of second $Al_yGa_{1-y}As$ thin films ($0<x<y\leq 1$).

In a preferred embodiment, the quantum well region is sandwiched between GRIN layers, the AlAs mole fraction of each varying according to the parabolic distribution.

In a preferred embodiment, the AlAs mole fraction of said quantum well region repeatedly varies from one fixed value to another.

Thus, the invention described herein makes possible the objectives of (1) providing a high quality superlattice quantum well semiconductor laser device that attains laser oscillation at a low threshold current level; (2) providing a superlattice quantum well semiconductor laser device in which deterioration of the quantum well layer can be suppressed to a large extent; and (3) providing a superlattice quantum well semiconductor laser device that can be produced by utilizing controllability in the layer thickness by MBE.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

This invention provides a superlattice quantum well semiconductor laser device in which the superlattice quantum well region is constructed by $Al_xGa_{1-x}As$ thin films containing undeteriorative aluminum (but not constructed by deteriorative GaAs layers) so that the superlattice quantum well region can be suppressed even though the quantum well semiconductor laser device continuously performs oscillating-operation.

The superlattice quantum well region is composed of alternate layers consisting of a plurality of first $Al_xGa_{1-x}As$ ($x>0$) and a plurality of second $Al_yGa_{1-y}As$ ($x<y\leq 1$).

EXAMPLE

Figure 1:
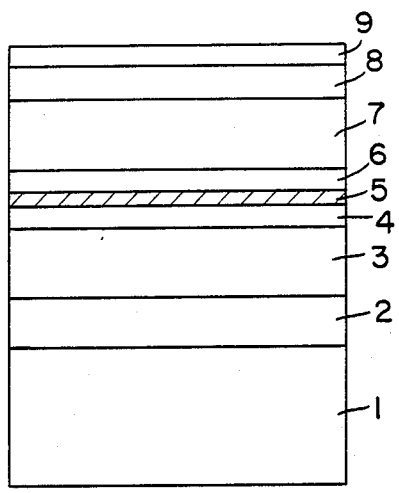
FIG. 1 is a front sectional view showing a quantum well semiconductor laser device with a superlattice structure of this invention.

FIG. 1 shows the superlattice quantum well semiconductor laser device, which is produced as follows: On an n-GaAs substrate (carrier density $Si=1\times10^{18}$ cm$^{-3}$) 1, an n-GaAs buffer layer ($Si=1\times10^{18}$ cm$^{-3}$, the thickness thereof being 0.5 μm) 2, an n-$Al_{0.7}Ga_{0.3}As$ cladding layer ($Si=1\times10^{18}$ cm$^{-3}$, the thickness thereof being 1.4 μm) 3, a non-doped $Al_xGa_{1-x}As$ GRIN layer (i.e., an optical guiding layer; the thickness thereof being 0.2 μm) 4, a non-doped $Al_{0.04}Ga_{0.96}As/Al_{0.28}Ga_{0.72}As$ superlattice quantum well layer 5 with a thickness of thirty mono-layers, 84.9 Å (which is composed of alternate layers consisting of four $Al_{0.04}Ga_{0.96}As$ layers with a six mono-layer thickness each and three $Al_{0.28}Ga_{0.72}As$ layers with a two mono-layer thickness each), a non-doped $Al_xGa_{1-x}As$ GRIN layer (the thickness thereof being 0.2 μm) 6, a p-$Al_{0.7}Ga_{0.3}As$ cladding layer ($Be=1\times10^{18}$ cm$^{-3}$, the thickness thereof being 1.4 μm) 7, a p-GaAs cap layer ($Be=1\times10^{18}$ cm$^{-3}$, the thickness thereof being 0.5 μm) 8, and an n-$Al_{0.5}Ga_{0.5}As$ current blocking layer ($Si=1\times10^{18}$ cm$^{-3}$, the thickness thereof being 0.7 μm) 9 are successively grown by MBE.

Then, the wafer is subjected to an etching treatment with an HF etchant to selectively etch the current blocking layer 9, resulting in a striped channel with a width of 5 μm, within which current is confined. Then, the back face of the n-GaAs substrate 1 and the upper face of the current blocking layer 9 including the p-GaAs cup layer 8 are subjected to evaporation with metals of Au-Ge/Ni and Au-Zn, respectively, followed by heating to form alloys of Au-Ge and GaAs and Au-Zn and GaAs so as to obtain n- and p-sided ohmic electrodes, respectively, resulting in a semiconductor laser device.

Figure 2:
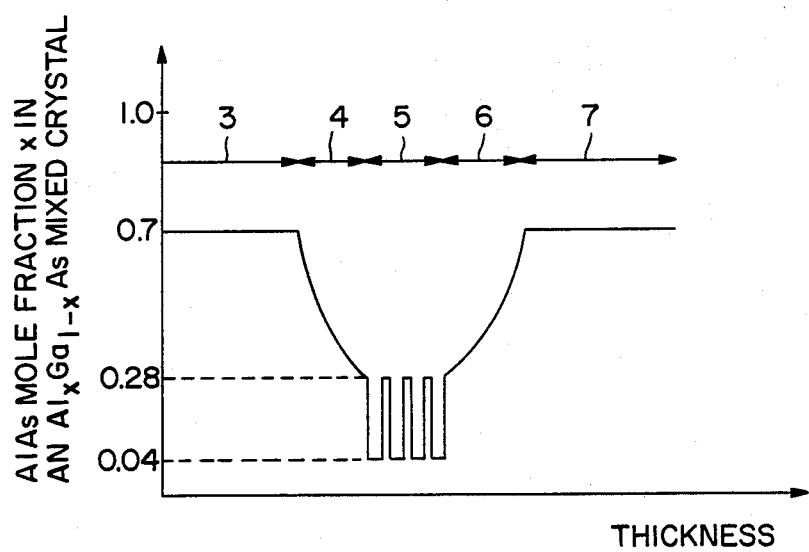
FIG. 2 is a graph showing the AlAs mole fraction (i.e., x) in an $Al_xGa_{1-x}As$ mixed crystal in the vicinity of the quantum well layer of the quantum well semiconductor laser device of this invention shown in FIG. 1.

FIG. 2 shows the AlAs mole fraction (i.e., x) in an $Al_xGa_{1-x}As$ mixed crystal in the vicinity of the quantum well layer 5 of the above-mentioned semiconductor laser device. It can be seen from FIG. 2 that the AlAs mole fraction of each of the GRIN layers 4 and 6 varies from 0.28 to 0.7 according to the parabolic distribution and the AlAs mole fraction of the superlattice quantum well layer 5 repeatedly varies from 0.04 to 0.28.

When the cavity length of the above-mentioned semiconductor laser device is set to be 250 μm, it oscillates laser light with an oscillation wavelength of 765 nm at a threshold current of 50 mA. The value of the said threshold current can be converted to an extremely low threshold current density of 383 A/cm$^2$, provided that the said semiconductor laser device with a striped structure is a semiconductor laser device with the whole area of the upper face of the wafer covered by a p-sided electrode.

Figure 3:
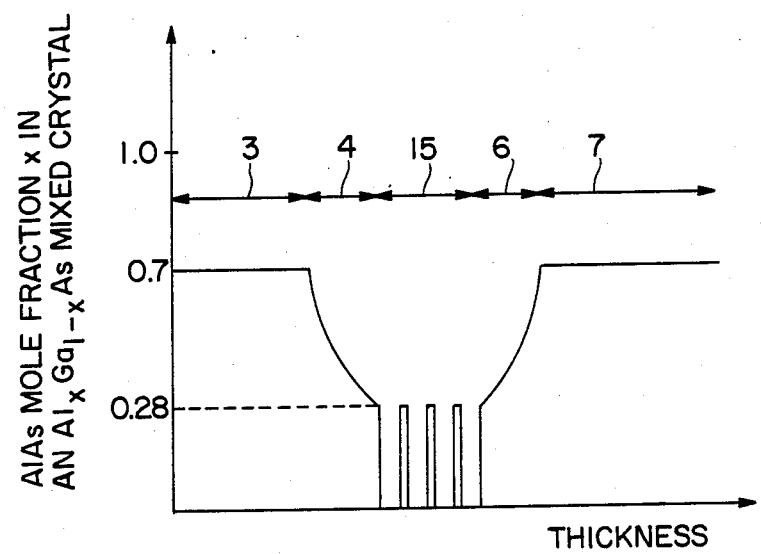
FIG. 3 is a graph showing the AlAs mole fraction (i.e., x) in an $Al_xGa_{1-x}As$ mixed crystal in the vicinity of the quantum well layer of a conventional GRIN-SCH superlattice quantum well semiconductor laser device producing a visible light.

The quantum well semiconductor laser device of this example with the AlAs mole fraction distribution shown in FIG. 2 was compared with a conventional quantum well semiconductor laser device with the AlAs mole fraction distribution shown in FIG. 3 and with the same striped structure as that of this example with regard to aging under conditions output power and temperatures were maintained to be at 3 mW and 30° C., respectively. The mean of the increasing rate of driving current during the aging of 1000 hours with regard to the semiconductor laser device of this example was about 1 mA/Kh, whereas that of the increasing rate of driving current during the aging of 1000 hours with regard to the conventional semiconductor laser device was about 2 mA/Kh. This means that the deterioration rate of the semiconductor laser device of this example is one half that of the conventional semiconductor laser device, so that deterioration of the semiconductor laser device can be suppressed better than had previously been possible.

It has been reported by, for example, T. Hayakawa et al., *Journal of Applied Physics* (vol. 52, No. 10, pp. 6068, 1981) that the deterioration rate of double-heterostructure semiconductor laser devices with an active layer of bulk $Al_xGa_{1-x}As$ containing Al in a proportion of several percents can be reduced to a great extent in comparison with that of double-heterostructure semiconductor laser devices with an active layer of bulk GaAs. For the same reason as the above-mentioned, when a quantum well layer having a superlattice structure is constituted by AlGaAs thin films containing Al rather than by GaAs thin films not containing Al, the deterioration of the quantum well semiconductor laser device with such a quantum well layer is presumed to be likewise suppressed.

Although the above-mentioned example only discloses a superlattice quantum well layer constituted by AlGaAs above, it is, of course, applicable to a superlattice quantum well layer constituted by alternate layers consisting of a plurality of AlGaAs thin films and a plurality of AlAs thin films and can attain the same effects as the above-mentioned. Moreover, the changes in the AlAs mole fraction over the entire area of the GRIN layers (i.e., the optical guiding layers) are not necessarily required, but the GRIN layers in which there are portions with a fixed value of the AlAs mole fraction can be used.

In addition, since the semiconductor laser device of this example has GRIN layers with an Al composition gradient, it can be produced by MBE using only two Al cells that function as an Al supplier.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising a substrate and a quantum well region with a superlattice structure that functions as an active region on said substrate, the improvement which comprises said superlattice quantum well region that is composed of alternate layers comprising a plurality of first $Al_xGa_{1-x}As$ thin films and a plurality of second $Al_yGa_{1-y}As$ thin films ($0<x<y\leq 1$, whereby deterioration of said superlattice quantum well region is suppressed.

2. A semiconductor laser device according to claim 1, wherein said quantum well region is sandwiched between GRIN layers, the AlAs mole fraction of said GRIN layers of each varying according to a parabolic distribution in the thickness direction of said GRIN layers.

3. A semiconductor laser device according to claim 1, wherein the AlAs mole fraction of said quantum well region repeatedly varies between a first fixed level and a second fixed level that is lower than said first fixed level.

* * * * *